(12) United States Patent
Kawada et al.

(10) Patent No.: US 6,681,693 B2
(45) Date of Patent: Jan. 27, 2004

(54) IMAGE RECORDING APPARATUS WITH DRUM BALANCING

(75) Inventors: Toru Kawada, Kyoto (JP); Toshio Tamura, Kyoto (JP); Shiro Kitawaki, Kyoto (JP); Ryuzo Tokimasa, Kyoto (JP)

(73) Assignee: Dainippon Screen Mfg., Co., Ltd., Kyoto (JP)

( * ) Notice: Subject to any disclaimer, the term of this patent is extended or adjusted under 35 U.S.C. 154(b) by 22 days.

(21) Appl. No.: 10/059,296

(22) Filed: Jan. 31, 2002

(65) Prior Publication Data

US 2002/0104452 A1 Aug. 8, 2002

(30) Foreign Application Priority Data

Feb. 7, 2001 (JP) ........................................ 2001-030753

(51) Int. Cl.$^7$ ................................................. F16F 15/34
(52) U.S. Cl. ...................... 101/216; 73/470; 74/573 R; 347/264
(58) Field of Search ................................. 101/216, 375, 101/415.1; 73/468, 470; 74/573 R; 347/264; 355/85, 104; 492/9; 494/82

(56) References Cited

U.S. PATENT DOCUMENTS

| | | | | |
|---|---|---|---|---|
| 4,903,957 A | * | 2/1990 | Binder et al. | 271/277 |
| 5,324,023 A | * | 6/1994 | Fedorjaka | 271/277 |
| 5,376,063 A | | 12/1994 | Greenstein | 73/470 |
| 5,813,346 A | | 9/1998 | Solomon | 101/375 |
| 5,903,300 A | * | 5/1999 | Suzuki | 347/261 |
| 6,412,413 B1 | * | 7/2002 | Tice et al. | 101/415.1 |
| 6,505,142 B1 | * | 1/2003 | Inoue et al. | 101/483 |

FOREIGN PATENT DOCUMENTS

JP 2977550 9/1999

* cited by examiner

*Primary Examiner*—Stephen R. Funk
(74) *Attorney, Agent, or Firm*—McDermott, Will & Emery

(57) ABSTRACT

An image recording apparatus for recording an image on a sensitive material mounted on a drum by emitting light beams to the sensitive material. The apparatus includes a cylindrical drum for supporting the sensitive material mounted peripherally thereof, a drive mechanism for rotating the drum with a rotary shaft disposed on an axis of the drum, guide members formed in opposite end surfaces of the drum and extending circumferentially about the rotary shaft, a pair of counterweights movable along each of the guide members, a moving mechanism for engaging each of the counterweights and moving relative to the drum, thereby to move the counterweight along the guide member, and a fixing mechanism for fixing the counterweight to the guide member in time of image recording.

6 Claims, 11 Drawing Sheets

IMAGE RECORDING APPARATUS WITH DRUM BALANCING

BACKGROUND OF THE INVENTION

1. Field of the Invention

The present invention relates to an image recording apparatus for recording an image on a sensitive material such as a printing plate mounted on a drum by emitting light beams to the sensitive material.

2. Description of the Related Art

Such an image recording apparatus includes a cylindrical drum for carrying a sensitive material mounted peripherally thereof, a drive mechanism for rotating the drum with a rotary shaft disposed on a drum axis, and a recording head for emitting light beams modulated according to image signals. This image recording apparatus records a desired image on the sensitive material mounted peripherally of the drum by causing the recording head to emit light beams to the sensitive material and moving the recording head in a direction parallel to the rotary shaft of the drum while rotating the drum at high speed.

In this type of image recording apparatus, a sensitive material of varied size is mounted on the drum. The sensitive material is mounted on the drum with opposite ends of the material fixed to the peripheral surface of the drum by using clamping mechanisms. The clamping mechanisms are in an arrangement variable with the size of the sensitive material. Consequently, the center of gravity of the drum is shiftable with the size of the sensitive material mounted peripherally of the drum.

On the other hand, the drum itself must be rotated at high speed for the purpose of high-speed image recording. When the center of gravity of the drum having a sensitive material mounted thereon is not located adjacent the rotary shaft, forced vibration will occur with the drum in high-speed rotation. Such vibration not only baffles high-precision image recording, but could damage the apparatus itself.

In view of the above, Japan Patent No. 2,977,550 has proposed an image recording apparatus having a plurality of counterweights in the form of permanent magnets movably and fixably arranged circumferentially about a rotary shaft of a drum. With this prior image recording apparatus, the center of gravity of the drum with a sensitive material mounted thereon may be located adjacent the rotary shaft of the drum, regardless of the size of the sensitive material mounted peripherally of the drum, by adjusting positions of the counterweights. Thus, the drum may be rotated at high speed without vibrating the drum.

However, the image recording apparatus described in Patent No. 2,977,550, which relies on magnetism for attaching the counterweights to the drum, has a drawback that the counterweights could move in time of image recording.

That is, where, as in the image recording apparatus described in Patent No. 2,977,550, magnetism or other friction mechanism is used to attach counterweights to a drum by a predetermined frictional force, strong torque is required for moving the counterweights relative to the drum to adjust the location of the center of gravity. On the other hand, there occurs a conflicting problem that the counterweights could move when the drum is accelerated or decelerated with a strong force at a start or finish of image recording.

SUMMARY OF THE INVENTION

The object of the present invention, therefore, is to provide an image recording apparatus that allows counterweights to be moved by small torque when adjusting the location of the center of gravity, while reliably preventing movement of the counterweights in time of image recording.

The above object is fulfilled, according to the present invention, by an image recording apparatus for recording an image on a sensitive material mounted on a drum by emitting light beams to the sensitive material, comprising a cylindrical drum for supporting the sensitive material mounted peripherally thereof; a drive mechanism for rotating the drum with a rotary shaft disposed on an axis of the drum; guide members formed in opposite end surfaces of the drum and extending circumferentially about the rotary shaft; a pair of counterweights movable along each of the guide members; a moving mechanism for engaging each of the counterweights and moving relative to the drum, thereby to move each counterweight along the guide member; and a fixing mechanism for fixing each counterweight to the guide member in time of image recording.

With this image recording apparatus, when adjusting the location of the center of gravity, the counterweights may be moved along the guide member by small torque. In time of image recording, the counterweights may reliably be held against movement by the action of the fixing mechanism.

In one preferred embodiment, the fixing mechanism includes an engaging device having numerous engaging elements formed circumferentially about the rotary shaft; a positioning device arranged on the pair of counterweights for engaging the engaging elements; and a biasing mechanism for biasing the positioning device toward the engaging device; the moving mechanism moving the positioning device in a direction to disengage from the engaging elements when the counterweights are moved.

Preferably, the engaging device includes an index plate defining numerous engaging bores, acting as the numerous engaging elements, arranged at intervals of fixed angle θ circumferentially about the rotary shaft, the positioning device comprising positioning pins for engaging the engaging bores. This construction is effective to prevent movement of the counterweights.

It is preferred that, in the above construction, the positioning pins are extendible and retractable relative to each counterweight, the number of the positioning pins being n which is an integer of 2 or more, each of the positioning pins being out of phase with the engaging bores by θ/n. Then, the counterweights may be positioned with a resolution of angle θ/n.

The image recording apparatus may further comprise a sensor for detecting a position relative to the drum of each counterweight fixed by the fixing mechanism. This construction enables a confirmation of the position of each counterweight.

In another aspect of the invention, an image recording apparatus is provided for recording an image on a sensitive material mounted on a drum by emitting light beams to the sensitive material, the apparatus comprising a cylindrical drum for supporting the sensitive material mounted peripherally thereof; a drive mechanism for rotating the drum with a rotary shaft disposed on an axis of the drum; guide members formed in opposite end surfaces of the drum and extending circumferentially about the rotary shaft; a pair of counterweights movable along each of the guide members; a moving mechanism for engaging each of the counterweights and moving relative to the drum, thereby to move each counterweight along the guide member; and a fixing mechanism for fixing each counterweight to the guide member in time of image recording, the fixing mechanism including: an index plate defining numerous engaging bores arranged at intervals of fixed angle θ circumferentially about the rotary shaft; positioning pins arranged on the pair of counterweights for engaging the engaging bores; and a biasing mechanism for biasing the positioning pins toward the engaging bores; the moving mechanism moving the positioning pins in a direction to disengage from the engaging bores when the counterweight is moved.

Other features and advantages of the present invention will be apparent from the following detailed description of the embodiments of the invention.

BRIEF DESCRIPTION OF THE DRAWINGS

For the purpose of illustrating the invention, there are shown in the drawings several forms which are presently preferred, it being understood, however, that the invention is not limited to the precise arrangement and instrumentalities shown.

DESCRIPTION OF THE PREFERRED EMBODIMENTS

Figure 1:
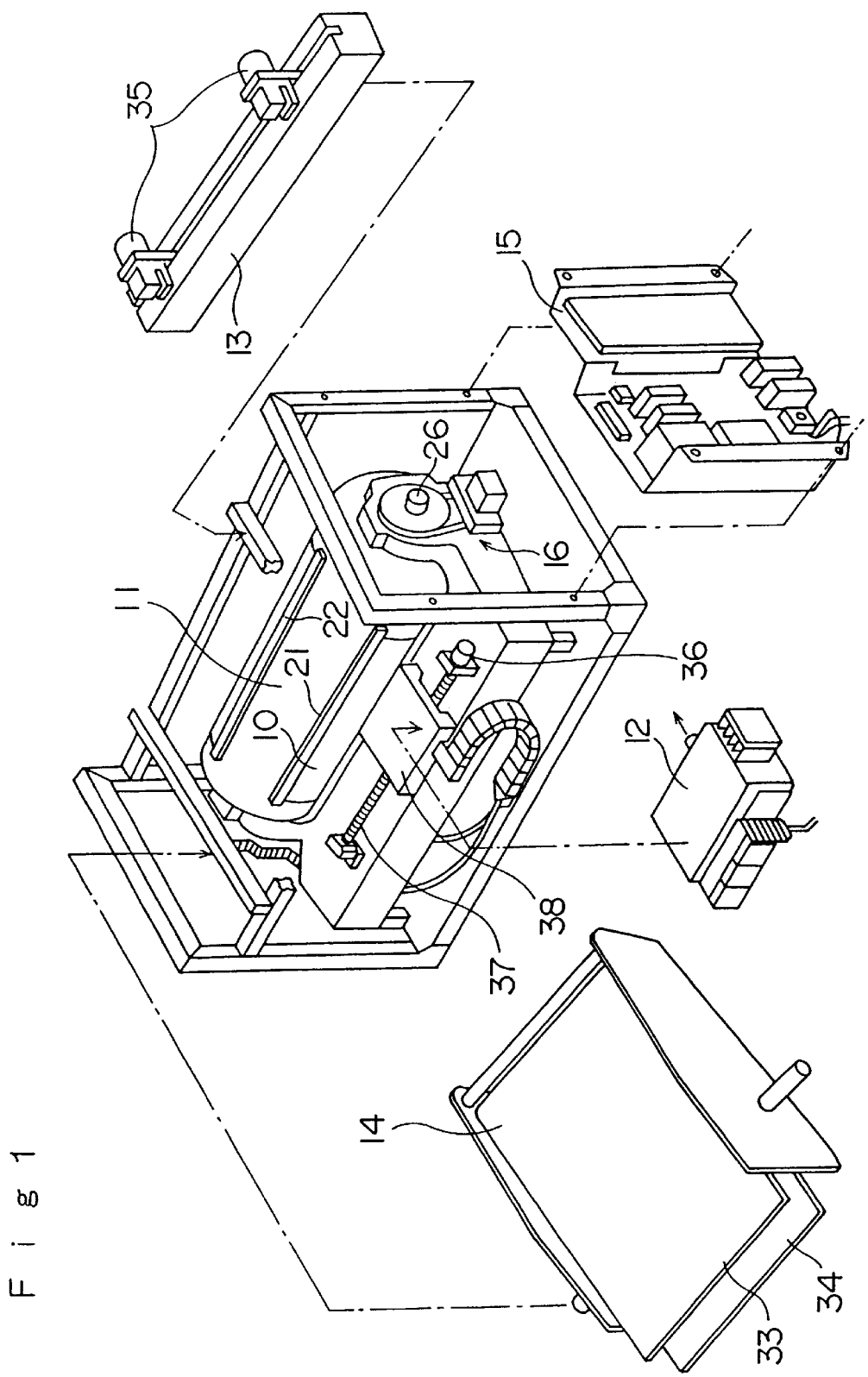
FIG. 1 is a partly exploded perspective view showing an outline of an image recording apparatus according to the present invention.
Figure 2:
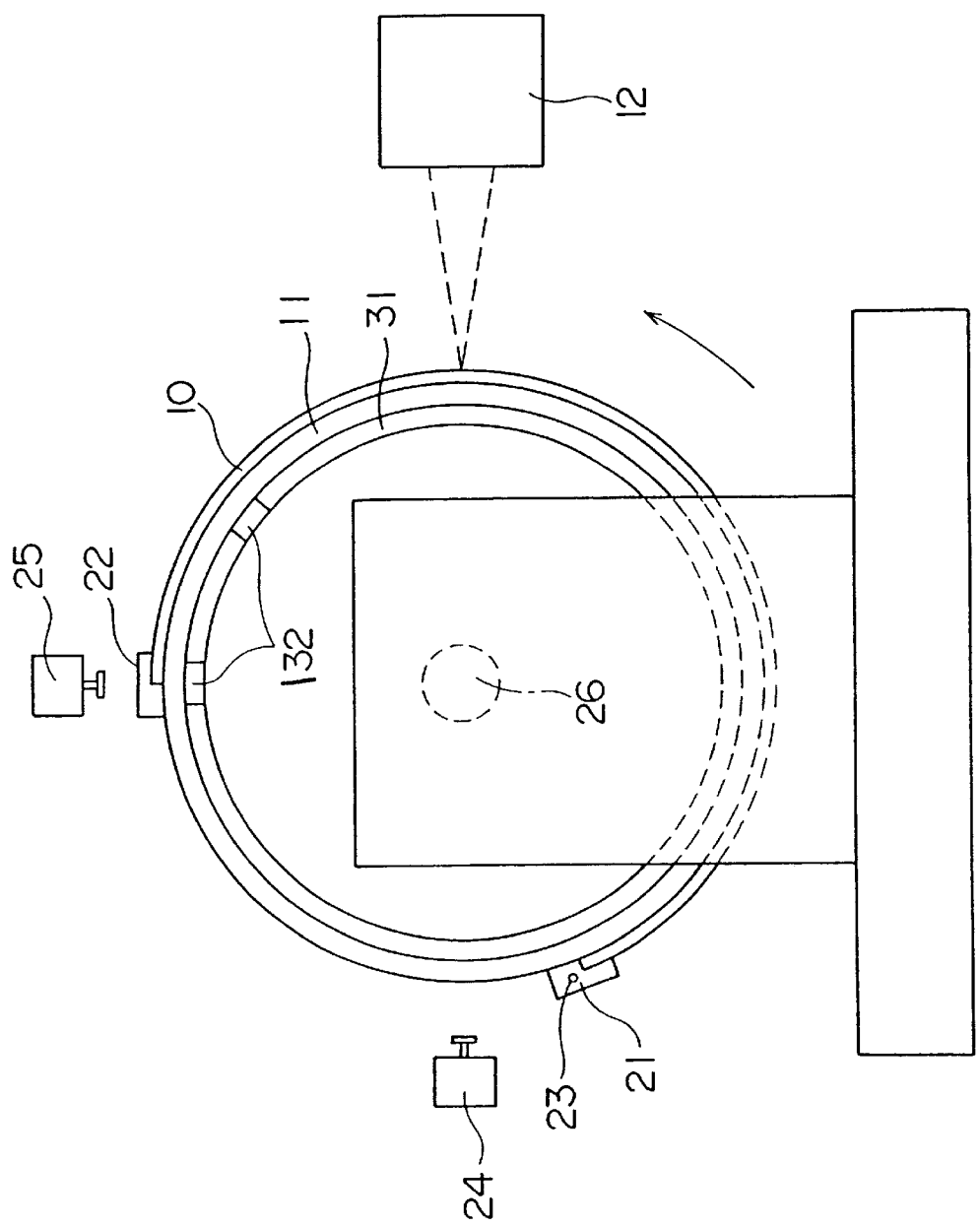
FIG. 2 is a schematic front view of the image recording apparatus according to the invention.

Embodiments of the present invention will be described hereinafter with reference to the drawings. FIG. 1 is a partly exploded perspective view showing an outline of an image recording apparatus according to the invention. FIG. 2 is a schematic front view of the apparatus.

This image recording apparatus includes a cylindrical drum 11, a recording head 12, a punch unit 13, a sensitive material feed unit 14 and an electrical unit 15.

The drum 11 serves to carry a sensitive material 10 mounted peripherally thereof, and includes a leading end clamp 21 for fixedly holding the leading end of sensitive material 10, a trailing end clamp 22 for fixedly holding the trailing end of sensitive material 10, and suction bores, not shown, for sucking the back of sensitive material 10. The leading end clamp 21 is pivotable about an axis 23 (FIG. 2) by the action of a leading clamp opening and closing mechanism 24, to switch between a position for holding the forward end of sensitive material 10 and a position for releasing the forward end. The trailing end clamp 22 is movable, by the action of a trailing end clamp opening and closing mechanism 25, between a position for holding and fixing the rear end of sensitive material 10 to the surface of drum 11 and a position separated from the drum 11 for releasing the rear end of sensitive material 10.

The drum 11 is driven by a drive mechanism 16 described hereinafter, to rotate with a rotary shaft 26 disposed on the axis of drum 11. The drum 11 has a guide groove 31 formed in each of opposite end surfaces thereof and extending circumferentially about the rotary shaft 26. A pair of counterweights 132 are arranged in each guide groove 31 to be movable therealong. Details of these guide grooves 31 and counterweights 132 will be described hereinafter.

The recording head 12 includes a plurality of light emitting elements, not shown, for emitting light beams modulated according to image signals to the sensitive material 10 mounted peripherally of the drum 11, thereby forming an image or images on the sensitive material 10. The recording head 12 is fixed to a movable table 38. This moving table 38 is meshed with a feed screw 37 rotatable by a motor 36. Thus, the recording head 12 is driven by the motor 36 to reciprocate parallel to the rotary shaft 26 of drum 11.

The punch unit 13 is operable to form positioning holes through the sensitive material 10 before mounting on the outer surface of drum 11. The punch unit 13 includes a pair of right and left punches 35.

The sensitive material feed unit 14 includes an upper tray 33 and a lower tray 34. Unused sensitive materials 10 are placed on the lower tray 34. A sensitive material 10 on the lower tray 34 is once transported to the punch unit 13, and is placed back on the lower tray 34 after positioning holes are formed therethrough. Then, this sensitive material 10 is transported from the lower tray 34 to the drum 11. The sensitive material 10 is mounted on the outer surface of drum 11 and, after an image is recorded, the sensitive material 10 is discharged onto the upper tray 33.

Figure 3:
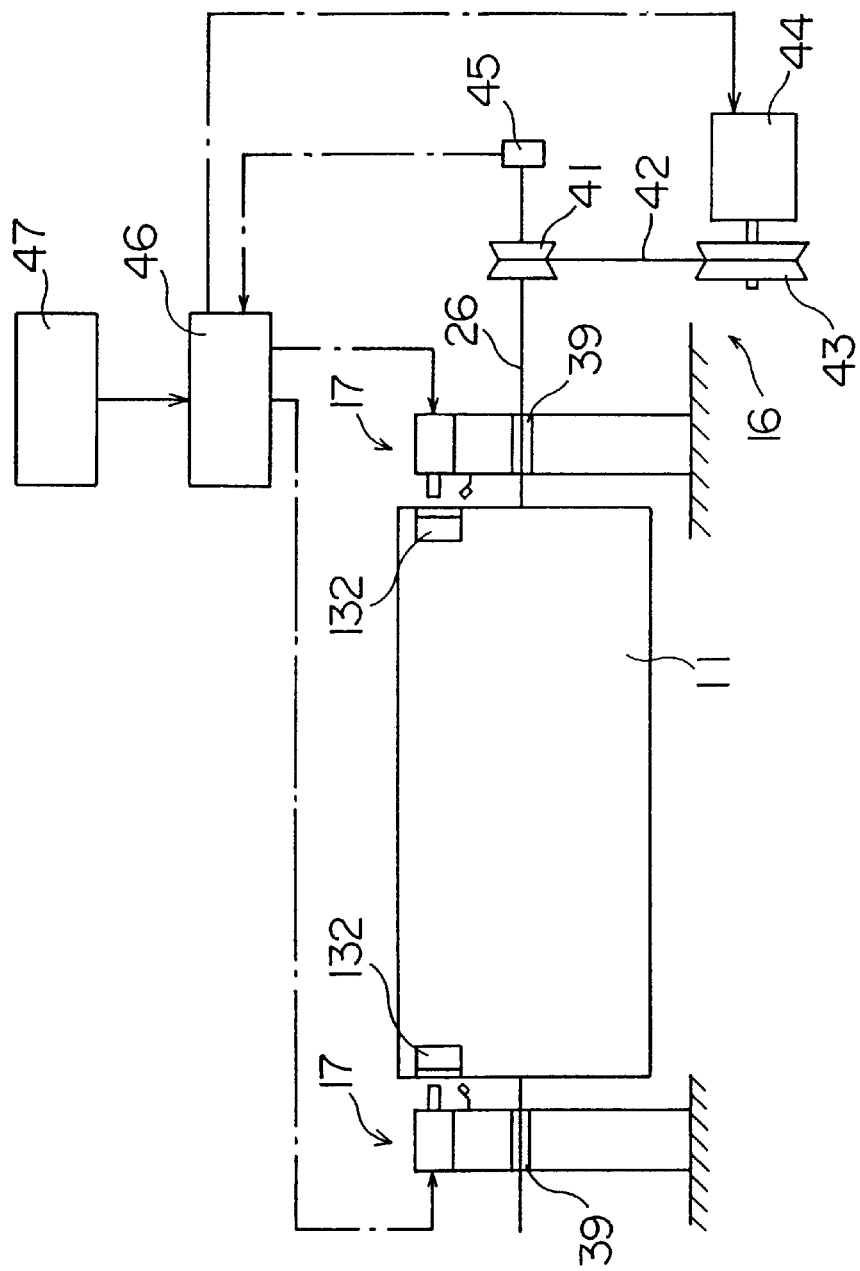
FIG. 3 is a schematic side view showing a drive mechanism for rotating a drum, and a moving mechanism for moving counterweights.

FIG. 3 is a side view showing the drum 11, the drive mechanism 16 for rotating the drum 11, and a moving mechanism 17 for moving the counterweights 132 along the guide grooves 31.

The drive mechanism 16 for rotating the drum 11 includes a pulley 41 fixed to the rotary shaft 26 of drum 11 supported by bearings 39, and a motor 44 connected to the pulley 41 through a belt 42 and a pulley 43. The rotary shaft 26 of drum 11 has a rotary encoder 45 attached thereto. Rotating angular positions of the drum 11 are constantly monitored by the rotary encoder 45.

The motor 44 of drive mechanism 16 and the rotary encoder 45 are connected to a controller 46. The controller 46 is connected to an input unit 47 having input devices such as a keyboard and the like. The controller 46 is connected also to the moving mechanism 17, described hereinafter, for moving the counterweights 132 along the guide grooves 31.

Figure 4:
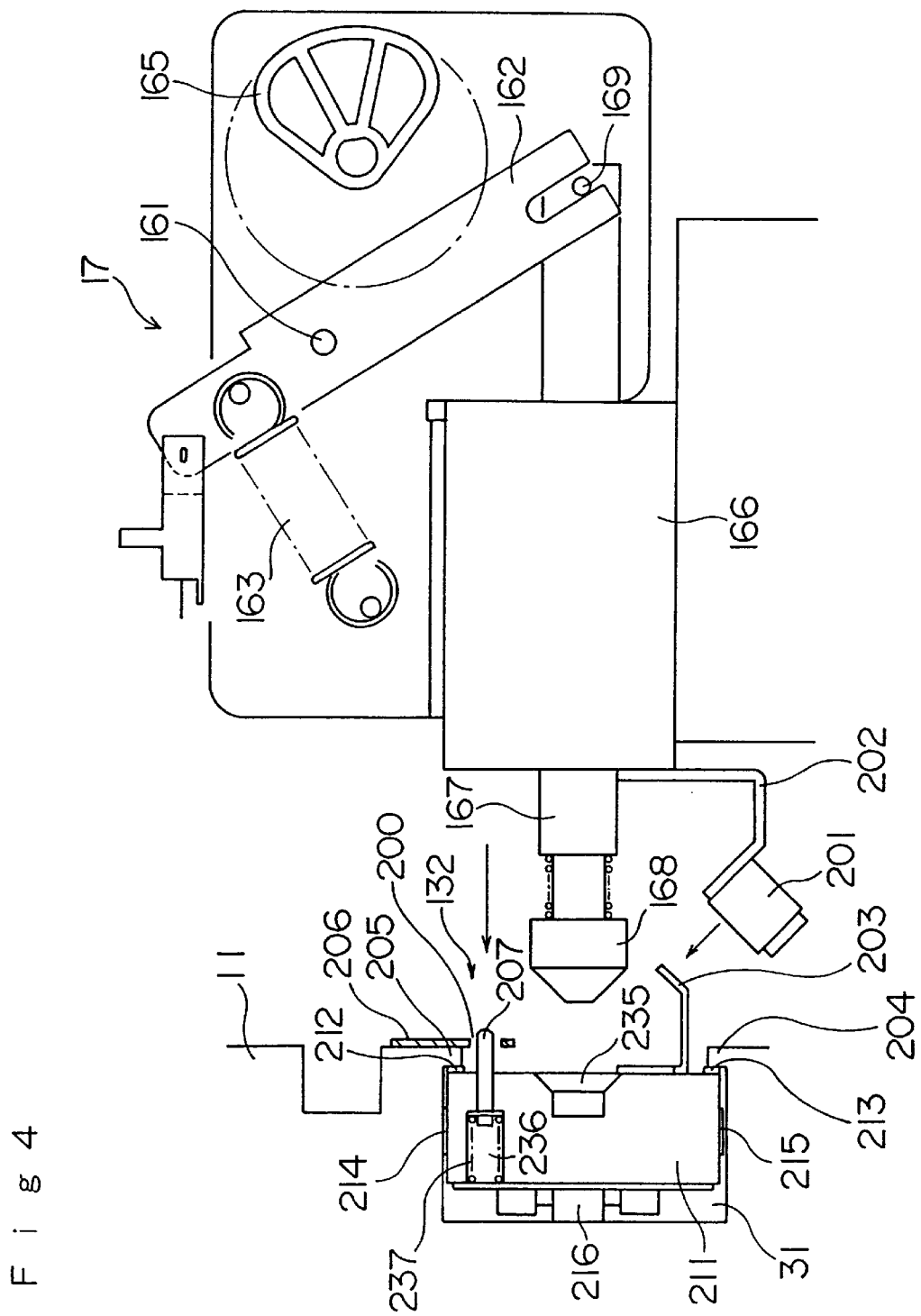
FIG. 4 is a schematic side view showing the moving mechanism along with a counterweight.
Figure 5:
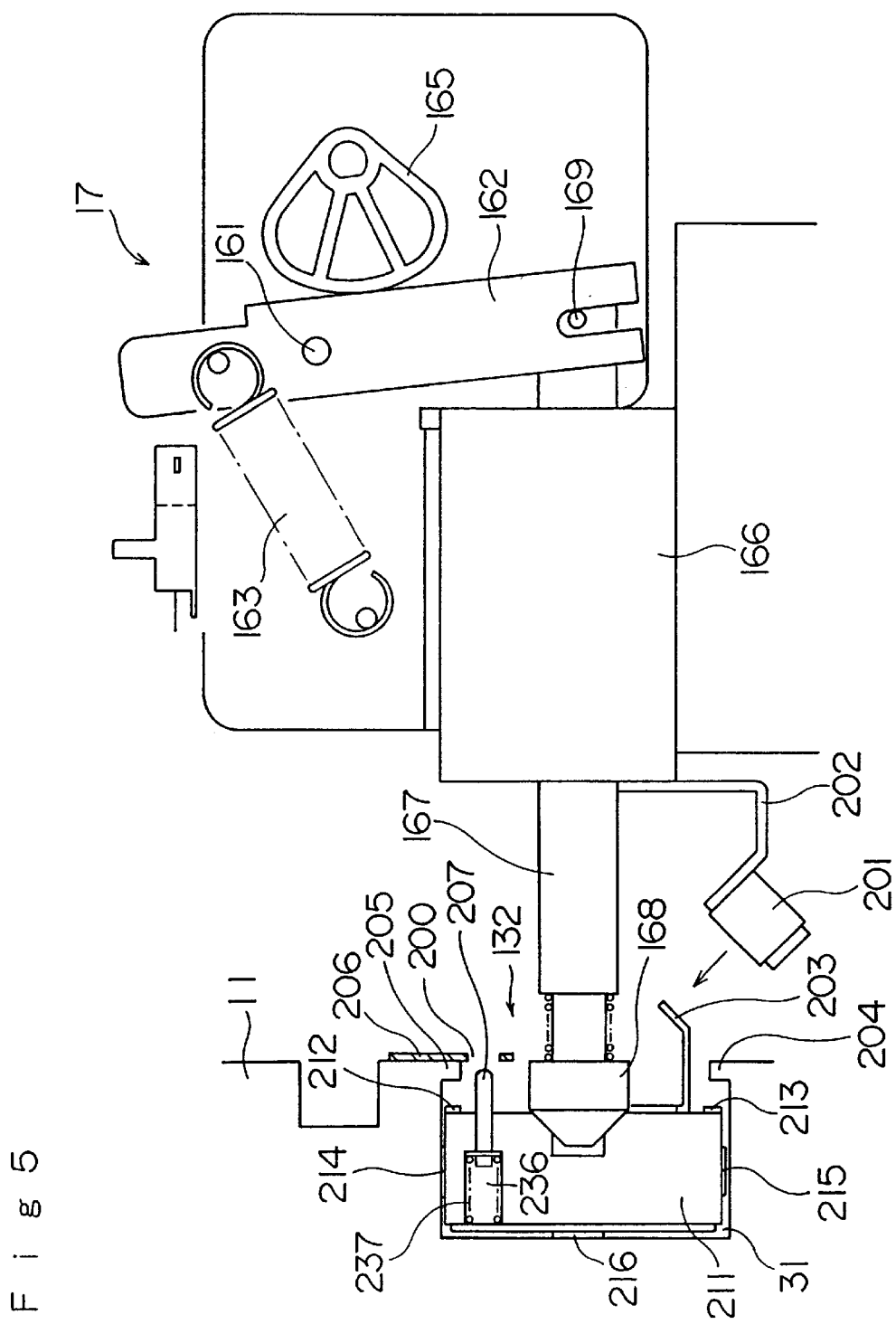
FIG. 5 is a schematic side view showing the moving mechanism along with the counterweight.

FIGS. 4 and 5 are schematic side views showing the moving mechanism 17 along with one counterweight 132 disposed in one guide groove 31 of drum 11. FIG. 4 shows the counterweight 132 not being pressed by a presser 168 of the moving mechanism 17. FIG. 5 shows the counterweight 132 being pressed by the presser 168 of the moving mechanism 17.

The moving mechanism 17 includes a drive plate 162 pivotable about a support axis 161 and having a U-shaped groove at an extreme end thereof. This drive plate 162 is biased counterclockwise in FIGS. 4 and 5, by a spring 163 connected to a proximal portion thereof The moving mechanism 17 further includes a cam 165 rotatable by a motor not shown. The cam 165, when rotated, biases the drive plate 162 clockwise in FIGS. 4 and 5.

The moving mechanism 17 includes a drive member 167 with the presser 168 attached to a forward end thereof. The drive member 167 is horizontally movably supported by a guide member 166. The drive member 167 has an engaging pin 169 erected at a rearward, proximal end thereof. The engaging pin 169 is engaged with the U-shaped groove formed in the extreme end of drive plate 162.

With the moving mechanism 17 having the above construction, when, in the state shown in FIG. 4, the cam 165 is rotated clockwise by the motor, the drive plate 162 also pivots clockwise about the support axis 161 as shown in FIG. 5. The drive member 167 is thereby pushed through the engaging pin 169 to move toward the counterweight 132 in the drum 11 (leftward in FIGS. 4 and 5). As a result, the presser 168 at the forward end of drive member 167 presses on the counterweight 132.

A sensor 201 is attached through a bracket 202 to one end of guide member 166. This sensor 201 is used to detect a sensor dog 203 of counterweight 132 to be described hereinafter.

As shown in FIGS. 4 and 5, a pair of tongues 204, 205 are formed along edges of the guide groove 31 of drum 11 to retain the counterweights 132 in the guide groove 31. An index plate 206 is disposed outwardly of the tongue 205.

Figure 6:
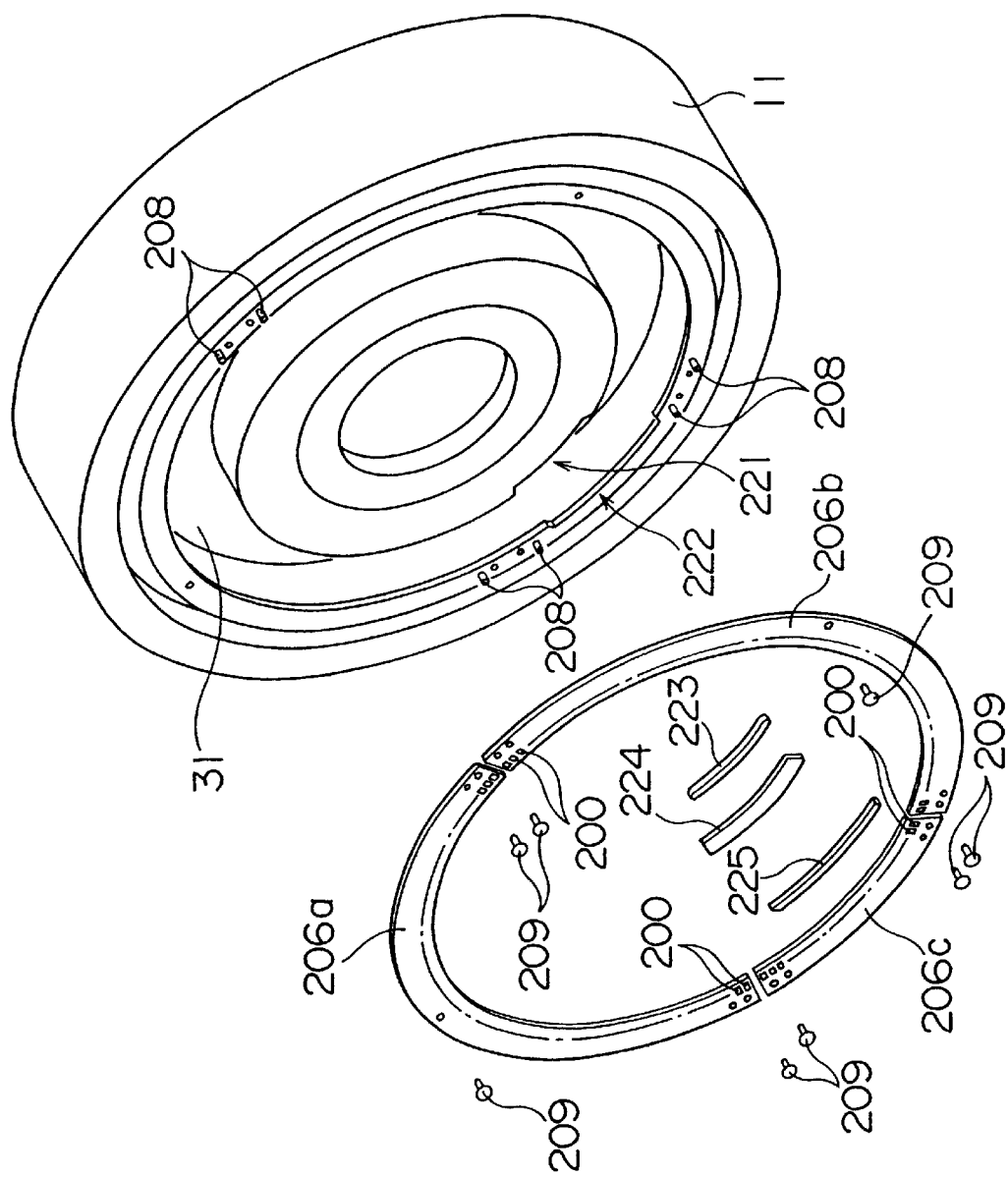
FIG. 6 is a perspective view showing attachment of an index plate to the drum.

FIG. 6 is a perspective view showing attachment of the index plate 206 to the drum 11. Though only one end of the drum 11 is shown in FIG. 6, a similar index plate 206 is disposed on the other end of the drum 11.

As shown in FIG. 6, the guide groove 31 acting as a guide member for guiding the counterweights 132 is formed to extend along the circumference about the rotary shaft 26 of drum 11 (see FIGS. 1 through 3). Laterally of the guide groove 31, three index plates 206a, 206b and 206c (which may be collectively called in this specification "index plate 206") are arranged coaxially with the guide groove 31.

These three index plates 206a, 206b and 206c are positioned by pins 208 erected on the drum 11, and fixed to each end surface of drum 11 with screws 209.

Each of the three index plates 206a, 206b and 206c has numerous engaging bores 200 formed therein at intervals of fixed angle θ along the circumference about the rotary shaft 26 of drum 11. The center of a gap between an adjacent pair of index plates 206a, 206b and 206c is spaced by angle θ from the center of engaging bore 200 at each end of the adjacent pair of index plates 206a, 206b and 206c. Thus, the engaging bores 200 and the gaps between the index plates 206a, 206b and 206c are arranged laterally of each guide groove 31 and at intervals of fixed angle θ along the circumference about the rotary shaft 26 of drum 11.

These engaging bores 200 and the gaps between the index plates 206a, 206b and 206c act as a fixing mechanism for fixing the counterweights 132 by engaging positioning pins 207 to be described hereinafter.

Instead of the three index plates 206a, 206b and 206c, a single circular index plate may be used. However, there is an advantage in dividing the index plate 206 into a plurality of parts as in this embodiment. That is, the three index plates 206a, 206b and 206c may be attached to the drum 11 and may be changed while the rotary shaft 26 of drum 11 remains supported by the bearings 39.

As noted hereinbefore, a pair of tongues 204, 205 are formed along edges of each guide groove 31 of drum 11 to retain the counterweights 132 in the guide groove 31. Thus, the guide groove 31 has cutouts 221 and 222 to enable the counterweights 132 to be inserted in the guide groove 31. After inserting the counterweights 132 in the guide groove 31, these cutouts 221 and 222 are closed with lid members 223, 224 and 225.

Figure 7:
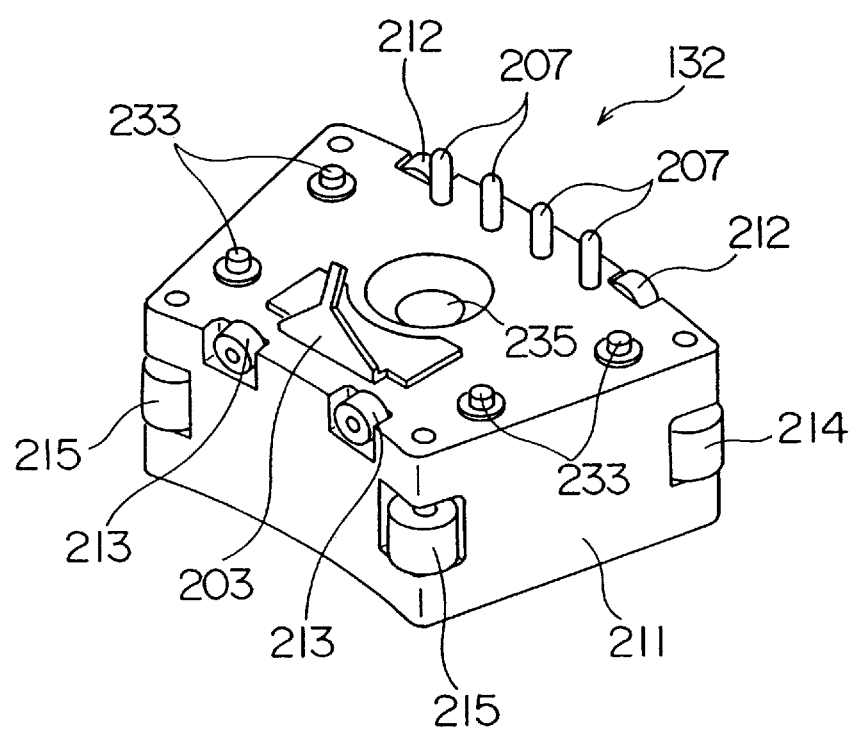
FIG. 7 is a perspective view of a counterweight.
Figure 8:
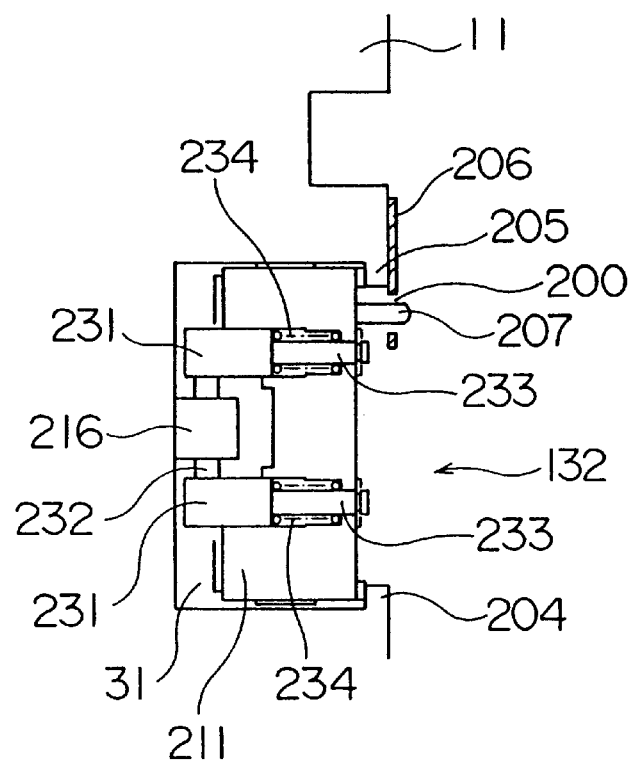
FIG. 8 is a side view of the counterweight disposed in a guide groove of the drum.
Figure 9:
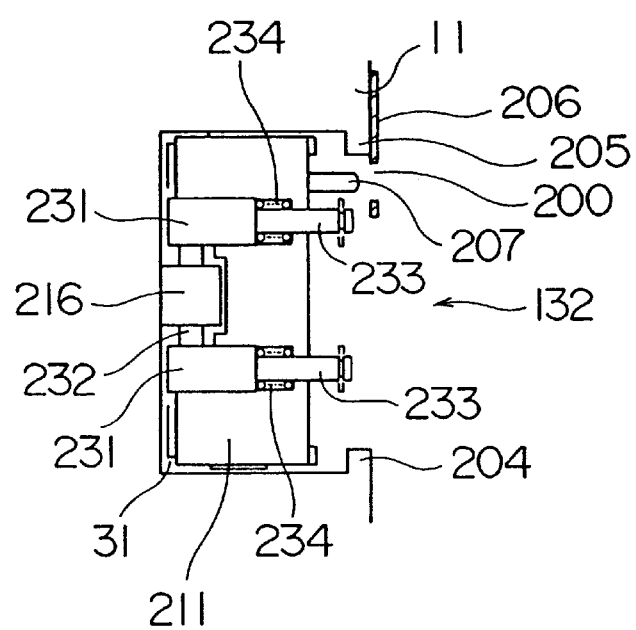
FIG. 9 is a side view showing the counterweight disposed in the guide groove of the drum.

Next, the construction of counterweights 132 will be described with reference to FIGS. 4, 5 and 7 through 9. FIG. 7 is a perspective view of one counterweight 132. FIGS. 8 and 9 are schematic side views of the counterweight 132 disposed in one guide groove 31 of drum 11. FIG. 8 shows the counterweight 132 not being pressed by the presser 168 of moving mechanism 17. FIG. 9 shows the counterweight 132 being pressed by the presser 168 of moving mechanism 17. FIGS. 4 and 5 schematically show a section including one positioning pin 207 of counterweight 132. FIGS. 8 and 9 show a section including one bearing 216 of counterweight 132.

The counterweight 132 includes a main weight body 211, a pair of bearings 212 for contacting an inner surface of the tongue 205 of drum 11, a pair of bearings 213 for contacting an inner surface of tongue 204 of drum 11, a pair of bearings 214 for contacting an outer wall of the guide groove 31 of drum 11, a pair of bearings 215 for contacting an inner wall of the guide groove 31 of drum 11, and a pair of bearings 216 for contacting a side wall of the guide groove 31 of drum 11. By the action of these bearings 212, 213, 214, 215 and 216, the counterweight 132 is easily movable within the guide groove 31 of drum 11.

As shown in FIGS. 8 and 9, each bearing 216 is rotatable about an axis 232 supported by a pair of support members 231. The pair of support members 231 have pins 233 connected thereto, respectively. Each pin 233 has a spring 234 mounted thereon for biasing the associated support member 231 in a direction to project from the main weight body 211.

Thus, by the action of these springs 234, the bearing 216 presses on the sidewall of guide groove 31. As a reaction thereof, as shown in FIGS. 4 and 8, the counterweight 132 is pressed toward the tongues 204, 205 and the index plate 206. On the other hand, as shown in FIGS. 5 and 9, the counterweight 132 moves toward the sidewall of guide groove 31 when pressed by the presser 168 of moving mechanism 17 as described hereinbefore.

These springs 234 and bearings 216, and a pressing mechanism of counterweight 132 such as springs 237 to be described hereinafter, act as a biasing mechanism for biasing the positioning pins 207 arranged on the counterweight 132 toward the index plate 206.

As shown in FIGS. 4 and 7, the main weight body 211 of counterweight 132 has, formed in a surface opposite from the bearings 216, a recess 235 for engaging the presser 168 of moving mechanism 17. The sensor dog 203 is disposed below the recess 235, and four positioning pins 207 are arranged above the recess 235.

As shown in FIGS. 4 and 5, these positioning pins 207 are movable in recesses 236 formed in the main weight body 211, respectively. The recesses 236 accommodate springs 237 for biasing the positioning pins 207 in a direction to project from the main weight body 211. By the action of the springs 237 and others, the positioning pins 207 are extendible and retractable relative to the counterweight 132.

Figure 10A:
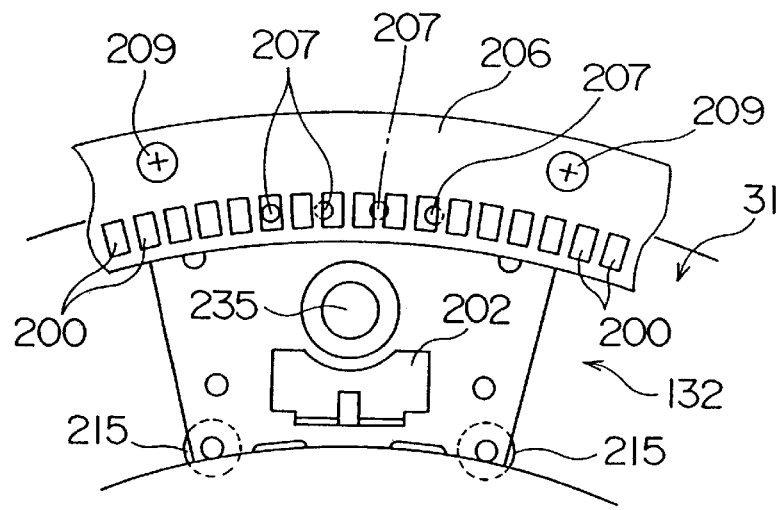
FIGS. 10A through 10C are explanatory views showing arrangements of engaging bores and positioning pins.
Figure 10B:
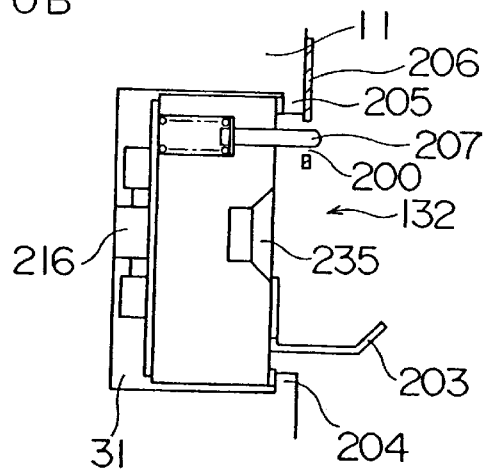
Figure 10C:
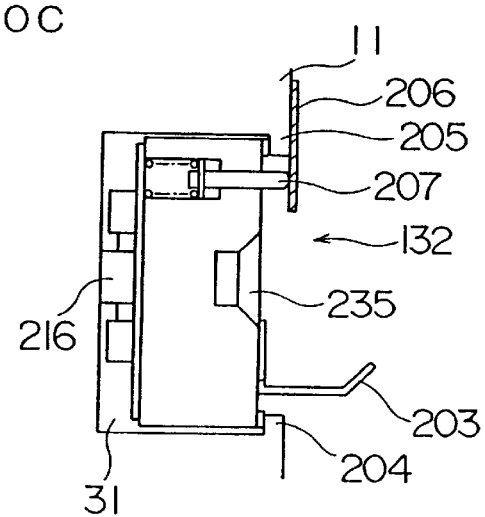

Next, a positional relationship between the engaging bores 200 formed in the index plate 206 and positioning pins 207 arranged on each counterweight 132 will be described. FIGS. 10A through 10C are explanatory views showing the positional relationship and engagement between the engaging bores 200 and positioning pins 207. FIG. 10A is a front view of the index plate 206, counterweight 132 and adjacent components. FIG. 10B schematically shows a section including one positioning pin 207 on the counterweight 132 engaged with one engaging bore 200.

FIG. 10C schematically shows a section including one positioning pin 207 on the counterweight 132 not engaged with any engaging bore 200.

As noted hereinbefore, the engaging bores 200 are formed at intervals of angle θ in the index plate 206. On the other hand, the four positioning pins 207 are arranged in positions out of phase by angle θ/4 with the engaging bores 200. That is, when the positioning pin 207 at an end is placed in phase with the engaging bores 200, the next positioning pin 207 is out of phase by angle θ/4 with the engaging bores 200, the third positioning pin 207 is out of phase by angle 2θ/4 with the engaging bores 200, and the positioning pin 207 at the other end is out of phase by angle 3θ/4 with the engaging bores 200.

As noted hereinbefore, each counterweight 132 is movable within the guide groove 31 of drum 11 by the action of bearings 212, 213, 214, 215 and 216. When, as shown in FIG. 10B, one of the four positioning pins 207 is engaged with one of the engaging bores 200 formed in the index plate 206, the counterweight 132 is fixed to that position. Resolution for fixed positions of the counterweight 132 is angle θ/4 which is angle θ between the engaging bores 200 in the index plate 206 divided by 4, i.e. the number of positioning pins 207.

Specifically, in the embodiment shown in FIGS. 10A through 10C, the engaging bores 200 are formed in the index plate 206 at intervals of 2 degrees. On the other hand, the four positioning pins 207 are arranged in angular positions spaced from one another by 3.5 degrees. Resolution for fixed positions of the counterweight 132 is 0.5 degrees in this case. With the counterweight 132 arranged with such resolution for fixed positions, the center of gravity of the drum 11 having a sensitive material mounted thereon may be located adjacent the rotary shaft 26. The drum 11 may then be rotated at high speed without vibration.

Figure 11:
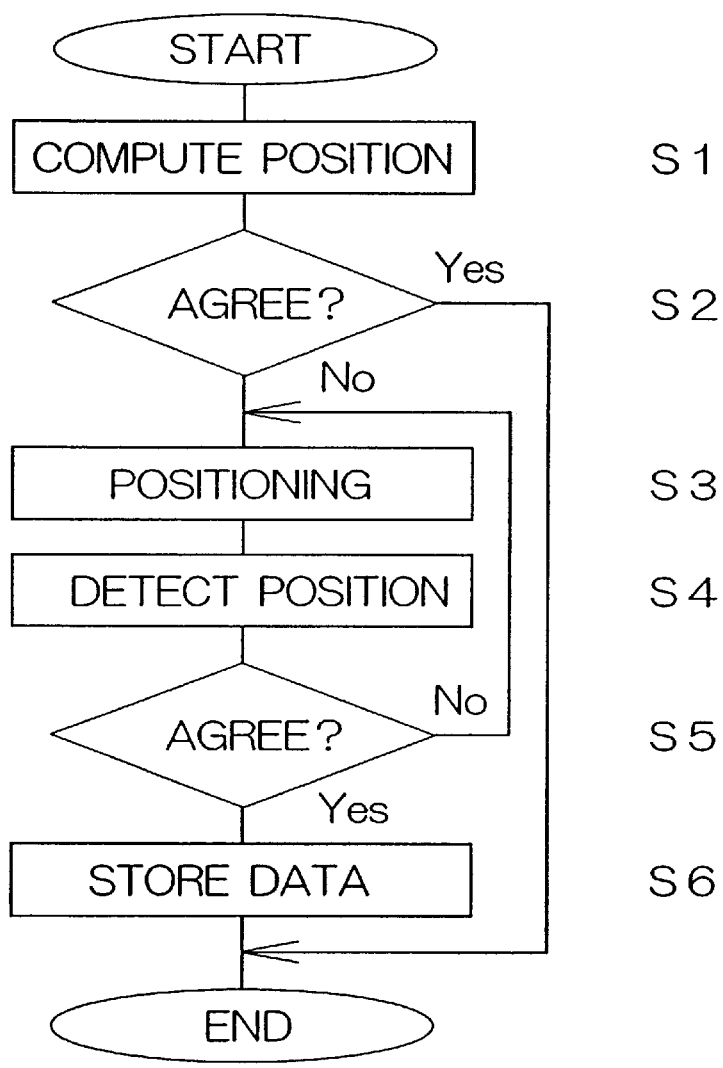
FIG. 11 is a flow chart showing an operation to adjust a position of a counterweight.

In the image recording apparatus having the above construction, the counterweights 132 may be moved to desired positions by taking the center of gravity of the drum 11 into account. An operation to adjust a position of each counterweight 132 will be described next. FIG. 11 is a flow chart showing this operation. For adjusting positions of a pair of counterweights 132, the operation shown in FIG. 11 is carried out for each counterweight 132.

In carrying out an operation to adjust a position of counterweight 132, a position to which the counterweight 132 should be set is computed based on the size of a sensitive material 10 mounted on the drum 11 for image recording (step S1).

Then, the position of counterweight 132 computed is compared with a current position of counterweight 132 (step S2). When the position of counterweight 132 computed coincides with the current position of counterweight 132, there is no need to perform an operation for adjusting the position of counterweight 132, and the operation is terminated.

When the position of counterweight 132 computed differs from the current position of counterweight 132, an operation for adjusting the position of counterweight 132 is performed (step S3).

In adjusting the position of counterweight 132, the drum 11 is first rotated by the motor 44 of drive mechanism 16. As shown in FIG. 4, the recess 235 in one of the two counterweights 132 to be moved first is placed opposite the presser 168 of moving mechanism 17. Next, as shown in FIG. 5, the presser 168 of moving mechanism 17 is moved toward the counterweight 132. As a result, as shown in FIGS. 5 and 9, one of the positioning pins 207 becomes disengaged from one of the engaging bores 200 in the index plate 206, thereby allowing the counterweight 132 to move along the guide groove 31.

In this state, the drum 11 is rotated by the motor 44 of drive mechanism 16 to move the counterweight 132 to a desired position. At this time, the counterweight 132 is freely movable within the guide groove 31 by the action of bearings 214, 215 and 216. No frictional resistance is applied to such movement, and therefore no strong torque is required to rotate the drum 11.

Once the counterweight 132 reaches the desired position, the presser 68 of moving mechanism 17 is separated from the counterweight 132 as shown in FIG. 4. As a result, as shown in FIGS. 4, 8 and 10, one of the four positioning pins 207 engages one of the engaging bores 200 in the index plate 206, whereby the counterweight 132 is fixed to this position.

In rotating the drum 11 to move the counterweight 132 to the desired position, a rotational position of the drum 11 may be controlled by taking the relationship between the engaging bores 200 in the index plate 206 and each positioning pin 207 into account. This control will ensure that one of the four positioning pins 207 reliably engages one of the engaging bores 200 in the index plate 206 when the presser 168 of moving mechanism 17 is separated from the counterweight 132. Alternatively, a rotational position of the drum 11 may be controlled without taking the relationship between the engaging bores 200 in the index plate 206 and each positioning pin 207 into account. Then, the drum 11 is placed so that the counterweight 132 may coincide with a computed balancing position. In the latter case, one of the four positioning pins 207 engages one of the engaging bores 200 in the index plate 206 upon next rotation of the drum 11.

Upon completion of the operation to position the counterweight 132, an operation to detect the position of the counterweight 132 is carried out in order to determine whether the counterweight 132 is fixed to the desired position (step S4). This position detecting operation is carried out by causing the motor 44 of drive mechanism 16 to rotate the drum 11, causing the sensor 201 shown in FIGS. 4 and 5 to detect the sensor dog 203 of counterweight 132, and detecting a signal outputted from the rotary encoder 45 at that time.

When the detected position of counterweight 132 differs from a target position of counterweight 132, or when the position of counterweight 132 deviates in excess of a permissible extent from a target position, the operation to position the counterweight 132 (step S3) and the position detecting operation (step S4) are repeated (step S5). On the other hand, when the detected position of counterweight 132 coincides with a target position of counterweight 132, or when the position of counterweight 132 is found within a permissible range from a target position, the position data is stored in memory (step S6), and the operation to adjust the position of counterweight 132 is ended.

In the above embodiment, the pressing mechanism of counterweight 132 including the springs 234 and bearings 216 is used to bias the positioning pins 207 arranged on the counterweight 132, along with the counterweight 132 itself, toward the index plate 206. For moving the counterweight 132, the presser 168 of moving mechanism 17 presses on the counterweight 132 to move the positioning pins 207 with the counterweight 132, thereby breaking the engagement between one positioning pin 207 and one engaging bore 200 in the index plate 206. However, a biasing mechanism may be provided for biasing the positioning pins 207, independently of the counterweight 132, toward the index plate 206. In this case, the moving mechanism 17 is adapted to move only the positioning pin 207 out of engagement with the engaging bore 200 in the index plate 206.

In the foregoing embodiment, the engaging bores 200 are employed as engaging elements formed in the index plate 206. Engaging recesses or the like may be used in place of engaging bores 200. Or a comb-like engaging device may be used in place of engaging bores 200.

Further, in the foregoing embodiment, index plates 206 are attached to the side surfaces of drum 11. Index plates may be fitted in the guide grooves 31 in the drum 11.

The present invention may be embodied in other specific forms without departing from the spirit or essential attributes thereof and, accordingly, reference should be made to the appended claims, rather than to the foregoing specification, as indicating the scope of the invention.

This application claims priority benefit under 35 U.S.C. Section 119 of Japanese Patent Application No. 2001-030753 filed in the Japanese Patent Office on Feb. 7, 2001, the entire disclosure of which is incorporated herein by reference.

What is claimed is:

1. An image recording apparatus for recording an image on a sensitive material mounted on a drum by emitting light beams to the sensitive material, comprising:
   a cylindrical drum for supporting the sensitive material mounted peripherally thereof;
   a drive mechanism for rotating said drum with a rotary shaft disposed on an axis of the drum;
   guide members formed in opposite end surfaces of said drum and extending circumferentially about said rotary shaft;
   a pair of counterweights movable along each of said guide members;
   a moving mechanism for engaging each of said counterweights and moving relative to said drum, thereby to move each counterweight along said guide member;
   a fixing mechanism for fixing each counterweight to said guide member in time of image recording, wherein said fixing mechanism includes
      engaging means having numerous engaging elements formed circumferentially about said rotary shaft;
      positioning means arranged on said pair of counterweights for engaging said engaging elements; and
      a biasing mechanism for biasing said positioning means toward said engaging means;
   said moving mechanism moving said positioning means in a direction to disengage from said engaging elements when said counterweights are moved,
   said engaging means includes an index plate defining numerous engaging bores, acting as said numerous engaging elements, arranged at intervals of fixed angle θ circumferentially about said rotary shaft;
   said positioning means comprising Positioning pins for engaging said engaging bores; and
   said positioning pins are extendible and retractable relative to each counterweight, the number of said positioning pins being n which is an integer of 2 or more, each of said positioning pins being out of phase with said engaging bores by θ/n.

2. An image recording apparatus as defined in claim 1, further comprising a sensor for detecting a position relative to said drum of each counterweight fixed by said fixing mechanism.

3. An image recording apparatus for recording an image on a sensitive material mounted on a drum by emitting light beams to the sensitive material, comprising:
   a cylindrical drum for supporting the sensitive material mounted peripherally thereof;
   a drive mechanism for rotating said drum with a rotary shaft disposed on an axis of the drum;
   guide members formed in opposite end surfaces of said drum and extending circumferentially about said rotary shaft;
   a pair of counterweights movable along each of said guide members;
   a moving mechanism for engaging each of said counterweights and moving relative to said drum, thereby to move each counterweight along said guide member; and
   a fixing mechanism for fixing each counterweight to said guide member in time of image recording, said fixing mechanism including:
      an index plate defining numerous engaging bores arranged at intervals of fixed angle θ circumferentially about said rotary shaft;
      positioning pins arranged on said pair of counterweights for engaging said engaging bores;
      a biasing mechanism for biasing said positioning pins toward said engaging bores;
   said moving mechanism moving said positioning pins in a direction to disengage from said engaging bores when said counterweight is moved; and
   said positioning pins are extendible and retractable relative to each counterweight, the number of said positioning pins being n which is an integer of 2 or more, each of said positioning pins being out of phase with said engaging bores by θ/n.

4. An image recording apparatus as defined in claim 3, further comprising a sensor for detecting a position relative to said drum of each counterweight fixed by said fixing mechanism.

5. An image recording apparatus for recording an image on a sensitive material mounted on a drum by emitting light beams to the sensitive material, comprising:
   a cylindrical drum for supporting the sensitive material mounted peripherally thereof;
   a drive mechanism for rotating said drum with a rotary shaft disposed on an axis of the drum;
   guide grooves formed in opposite end surfaces of said drum and extending circumferentially about said rotary shaft;
   a pair of counterweights movable along each of said guide grooves;
   an index plate disposed to close at least part of each of said guide grooves and having a plurality of engaging bores formed circumferentially about said rotary shaft;
   means mounted in each of said guide grooves for biasing said counterweights toward said index plate;
   a plurality of positioning pins arranged on each of said counterweights to be extendible and retractable relative thereto; and
   moving means for engaging each of said counterweights and moving relative to said drum, thereby to move each counterweight along said guide grooves;
   wherein said plurality of positioning pins are arranged on each of said counterweights at intervals other than an integral multiple of intervals at which said plurality of engaging bores are arranged on said index plate; and
   said moving means is arranged to disengage said position pins from said engaging bores of said index plate by pressing each counterweight in said guide groove, and to move each counterweight in this state along said guide groove.

6. An image recording apparatus as defined in claim 5, further comprising a sensor for detecting a position relative to said drum of each counterweight fixed by said fixing mechanism.

* * * * *